(12) United States Patent
Liu

(10) Patent No.: US 7,385,441 B2
(45) Date of Patent: Jun. 10, 2008

(54) LEVEL SHIFTER WITH REDUCED POWER CONSUMPTION

(75) Inventor: Ping-Lin Liu, Hsinchu (TW)

(73) Assignee: TPO Displays Corp., Chu-Nan, Miao-Li County (TW)

( * ) Notice: Subject to any disclaimer, the term of this patent is extended or adjusted under 35 U.S.C. 154(b) by 23 days.

(21) Appl. No.: 11/535,499

(22) Filed: Sep. 27, 2006

(65) Prior Publication Data

US 2008/0074164 A1 Mar. 27, 2008

(51) Int. Cl.
*H03K 7/08* (2006.01)
(52) U.S. Cl. .................... 327/589; 326/88; 326/112
(58) Field of Classification Search ................ 327/298, 327/589, 534–537, 112, 390, 306, 333; 326/88, 326/92
See application file for complete search history.

(56) References Cited

U.S. PATENT DOCUMENTS 5,744,878 A * 4/1998 Wachter et al. ............. 370/130
5,828,262 A * 10/1998 Rees ........................... 327/390
6,246,296 B1 * 6/2001 Smith ......................... 332/109
6,891,422 B2    5/2005 Shin

FOREIGN PATENT DOCUMENTS

JP          2005123864      * 10/2003

* cited by examiner

*Primary Examiner*—Dinh T. Le
(74) *Attorney, Agent, or Firm*—Winston Hsu

(57) ABSTRACT

A buffer circuit has a first transistor and a second transistor in a cascode, and a buffer switch coupled from an output of the buffer to a gate of the second transistor. The buffer circuit is bootstrapped by a bootstrap capacitor, a diode circuit, and a bootstrap switch. The bootstrap capacitor is coupled from the output to the gate of the second transistor through the bootstrap switch. A potential difference is set up across the bootstrap capacitor through the diode circuit. When a low input is given to the buffer circuit, the second transistor turns off and the output goes to a high bias voltage through the first transistor. When a high input is given, the first transistor turns off, the second transistor turns on, and as the output goes low, the gate of the second transistor is bootstrapped to drop the output completely down to a low bias voltage.

17 Claims, 4 Drawing Sheets

LEVEL SHIFTER WITH REDUCED POWER CONSUMPTION

BACKGROUND OF THE INVENTION

1. Field of the Invention

The present invention relates to thin-film transistor (TFT) video processing circuits, and more particularly, the present invention discloses a level shifter circuit that uses a bootstrap circuit to decrease power consumption and decrease shifting time.

2. Description of the Prior Art

Logic circuitry for the LCD display typically comprises a vertical shift register and a level shifter. The vertical shift register enables one column of pixels at a time in succession. The level shifter increases a voltage range of a signal from the vertical shift register. For example, the level shifter may take an input ranging from 0V to 10V and convert the input to an output ranging from −5V to 10V. Please refer to FIG. 1, which shows a level shifter according to the prior art. The level shifter 10 comprises a first transistor M1 and a second transistor M2. The second transistor M2 is a diode-connected transistor. In this example, the first transistor M1 and the second transistor M2 are both p-type metal-oxide-semiconductor (PMOS) transistors. The input to the level shifter 10 is at a gate of the first transistor M1, and the level shifter 10 is powered by a 15V bias voltage source comprising an upper voltage bias VDD (10V) and a lower bias voltage VEE (−5V). When the input is 0V, the first transistor M1 turns on, and the output becomes approximately 10V. When the input is 10V, the first transistor M1 turns off, and a current flowing in the second transistor M2 begins to pull the output voltage down. To maintain the current flowing in the second transistor M2, a source-gate voltage Vsg must be greater than a threshold voltage Vth of the second transistor M2. Because the gate of the second transistor M2 is coupled to the lower bias voltage VEE, the output will never drop below a low output voltage VEE+Vth. This presents three disadvantages to the prior art architecture. First, the output cannot be pulled fully to the lower bias voltage VEE. In other words, the output has a limited range from the upper bias voltage VDD to the low output voltage VEE+Vth. Second, because the low output voltage is dependent on the threshold voltage Vth of the second transistor M2, process variation will make the low output voltage inconsistent. Third, because the second transistor M2 is diode-connected, the second transistor M2 is always on, which wastes power.

SUMMARY OF THE INVENTION

According to the present invention, a level shifter circuit comprises a buffer circuit and a bootstrap circuit. The buffer circuit comprises a first transistor having a control terminal coupled to an input of the level shifter circuit, a second transistor having a first terminal coupled to a first terminal of the first transistor, and a buffer switch having a first terminal coupled to the first terminal of the second transistor and a second terminal coupled to a control terminal of the second transistor. The bootstrap circuit comprises a diode circuit having a first terminal coupled to the input of the level shifter circuit, a bootstrap switch having a first terminal coupled to the control terminal of the second transistor, and a capacitor coupled between the first terminal of the second transistor and a second terminal of the bootstrap switch, and coupled to a second terminal of the diode circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
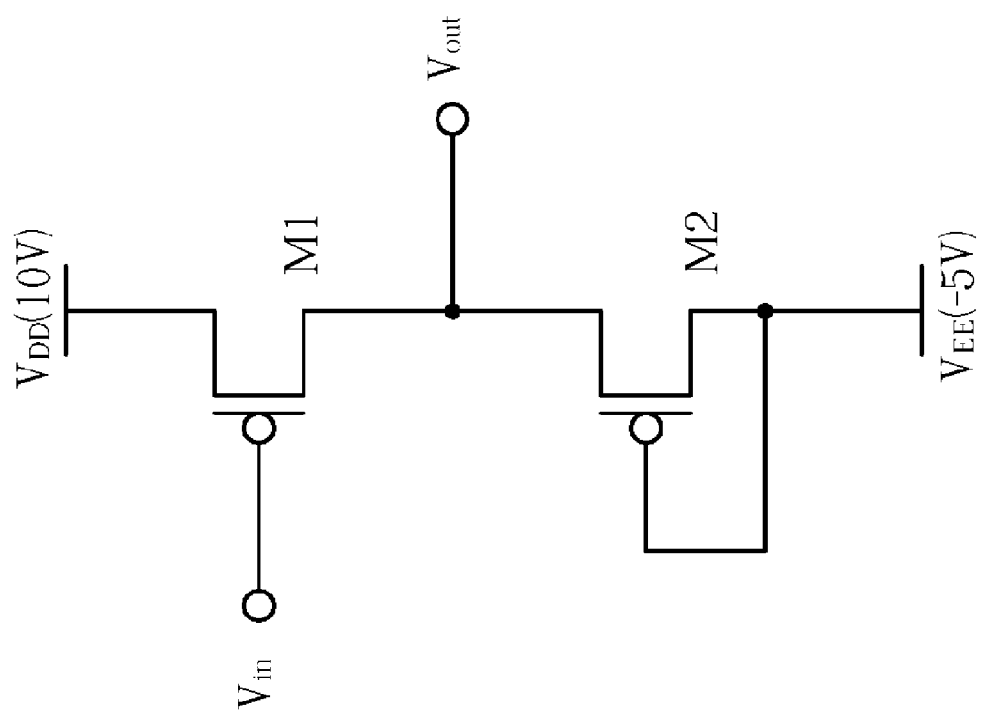
FIG. 1 is a transistor-level schematic of a level shifter circuit according to the prior art.

The present invention level shifter circuit incorporates a bootstrap circuit to overcome the disadvantages mentioned above of a limited low output voltage and a susceptibility to process variation in the threshold voltage of the second transistor. Please refer to FIG. 2, which is a diagram of a level shifter circuit 20 according to the present invention. The level shifter circuit 20 comprises a buffer circuit 21 and a bootstrap circuit 22. The buffer circuit 21, like the level shifter circuit 10 of FIG. 1, comprises a first transistor M1 and a second transistor M2. The first transistor M1 and the second transistor M2 are in a cascade arrangement, as shown. Unlike the level shifter circuit 10 of FIG. 1, however, the buffer circuit 21 further comprises a buffer switch S1 coupled between an output Vout and a gate of the second transistor M2, for enabling and disabling the second transistor M2. Particularly, when an input voltage Vin is low, for example 0V, the buffer switch S1 closes to turn off the second transistor M2. When the input voltage Vin is high, for example 10V, the buffer switch S1 opens to enable the second transistor M2. In this way, the present invention level shifter circuit 20 overcomes the disadvantage of the second transistor M2 being always on by turning the second transistor M2 off when the input voltage Vin is low.

The present invention level shifter circuit 20 further comprises the bootstrap circuit 22. The bootstrap circuit 22 comprises a bootstrap capacitor C, a bootstrap switch S2, and a diode circuit D. The bootstrap switch S2 is coupled between the bootstrap capacitor C and a gate of the second transistor M2. The bootstrap capacitor C is coupled to the output Vout, the bootstrap switch S2, and the diode circuit D. The diode circuit D is coupled to the input voltage Vin, the bootstrap capacitor C, and the bootstrap switch S2. The bootstrap switch S2 closes when the input voltage Vin is high, and opens when the input voltage Vin is low.

As described above, and as depicted in FIG. 2, the level shifter circuit 20 operates as follows. When the input voltage Vin is low, e.g. 0V, the first transistor M1 turns on. The buffer switch S1 closes, and the bootstrap switch S2 opens. At this point, the output voltage Vout becomes approximately equal to the upper bias voltage VDD, e.g. 10V. Because the buffer switch S1 is closed, a gate voltage of the second transistor M2 becomes approximately equal to the output voltage Vout. Because the gate voltage of the second transistor M2 approximately equals the output voltage Vout, which is present at a source of the second transistor M2, a source-gate voltage of the second transistor M2 becomes less than a threshold voltage of the second transistor M2, such that the second transistor M2 turns off. A voltage at a node between the diode circuit D and the bootstrap capacitor C becomes equal to a sum of the input voltage Vin and a diode voltage of the diode circuit D, which for an input voltage Vin of 0V is simply the diode voltage. Thus, a potential difference across the bootstrap capacitor C becomes approximately the upper bias voltage VDD minus the diode voltage.

When the input voltage Vin transitions from low to high, e.g. 0V to 10V, the buffer switch S1 opens and the bootstrap switch S2 closes. Further, the first transistor M1 turns off, because a source-gate voltage of the first transistor M1 becomes lower than a threshold voltage of the first transistor M1. At this point, the voltage at the node between the diode circuit D and the bootstrap capacitor C is transferred to the gate of the second transistor M2. Now that the gate voltage of the second transistor M2 is lower than the output voltage Vout, the second transistor M2 begins to conduct a current, which brings the output voltage Vout down. As the output voltage Vout decreases, because the potential difference across the bootstrap capacitor C remains constant, the gate voltage of the second transistor M2 drops with the output voltage Vout. In this way, the source-gate voltage of the second transistor M2 remains high, which keeps the second transistor M2 on until the output voltage Vout approaches the lower bias voltage VEE. In this way, the output voltage Vout can be lowered to the lower bias voltage VEE, eliminating the disadvantage of the limited low output voltage, and also eliminating the dependence of the low output voltage on the threshold voltage of the second transistor M2.

Figure 2:
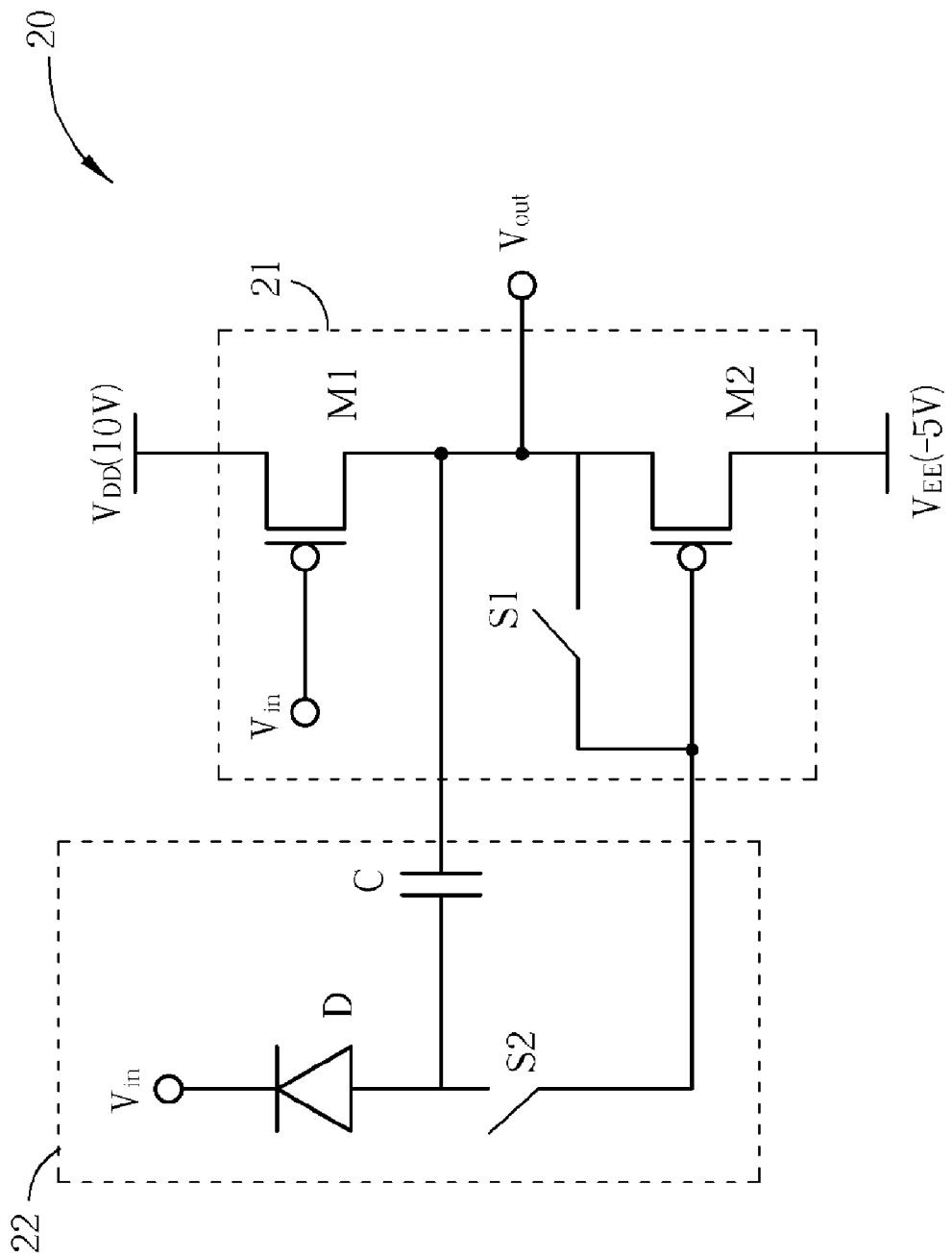
FIG. 2 is a diagram of a level shifter circuit according to the present invention.
Figure 3:
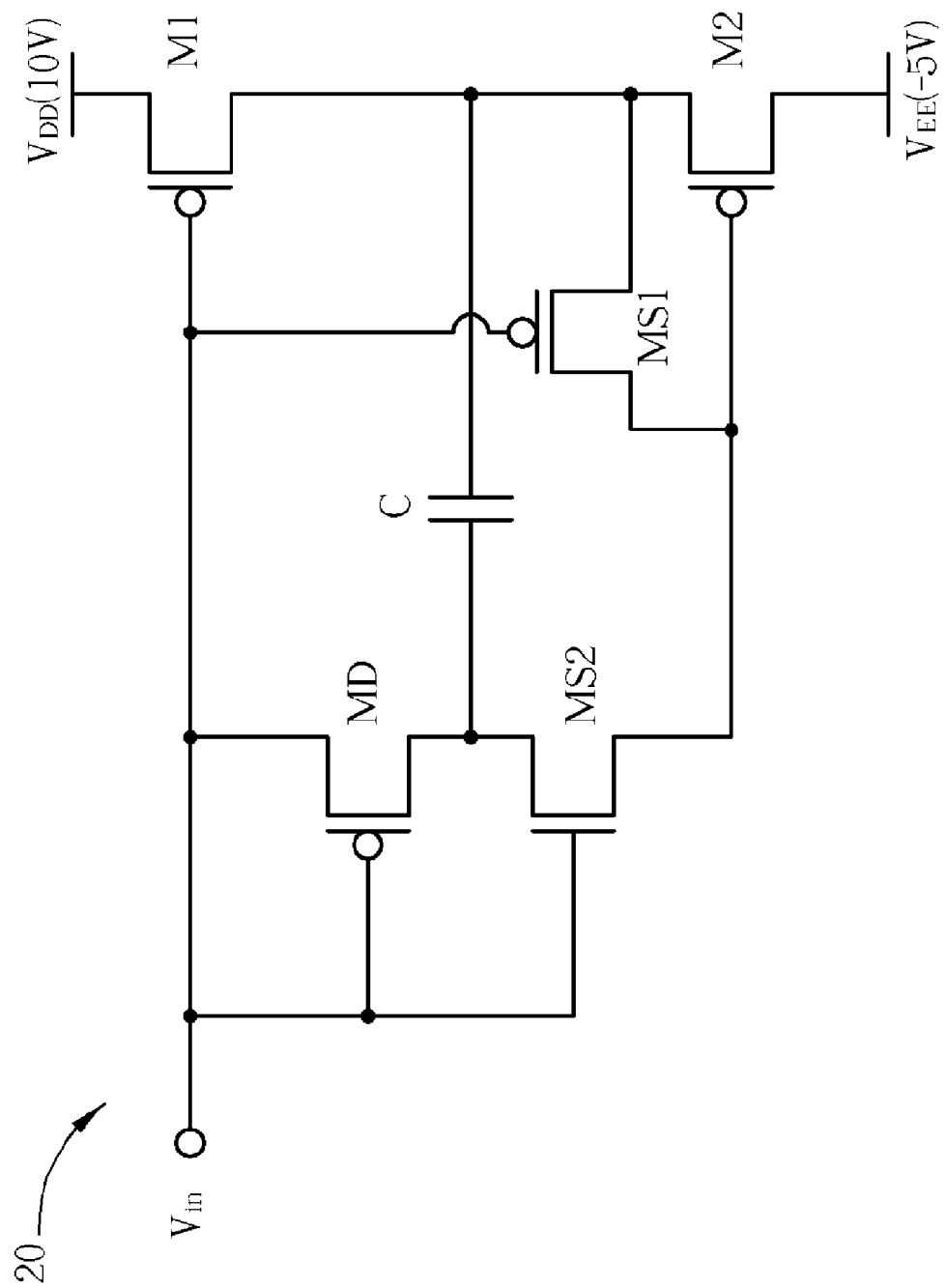
FIG. 3 is a transistor-level schematic of the level shifter circuit in FIG. 2.

Please refer to FIG. 3, which is a transistor-level diagram of the level shifter circuit 20 shown in FIG. 2. To achieve the operation described above using only integrated components, the present invention level shifter circuit 20 uses a buffer switch transistor MS1 for the buffer switch S1 of FIG. 2, a bootstrap switch transistor MS2 for the bootstrap switch S2 of FIG. 2, and a diode-connected transistor MD for the diode circuit D of FIG. 2. As shown, the buffer switch transistor MS1 is a PMOS transistor, and is driven at a gate of the buffer switch transistor MS1 by the input voltage Vin. In this way, when the input voltage Vin is low, e.g. 0V, the buffer switch transistor MS1 operates in a saturation region, and when the input voltage Vin is high, e.g. 10V, the buffer switch transistor MS1 operates in a cutoff region. Likewise, the diode-connected transistor MD is a PMOS transistor, and a gate of the diode-connected transistor MD is coupled to the input voltage Vin, to achieve the configuration shown in FIG. 2. Finally, the bootstrap switch transistor MS2 is an NMOS transistor, and a gate of the bootstrap switch transistor MS2 is coupled to the input voltage Vin. Thus, when the input voltage Vin is low, e.g. 0V, the bootstrap switch transistor MS2 operates in a cutoff region, and when the input voltage Vin is high, e.g. 10V, the bootstrap switch transistor MS2 operates in a saturation region. As described, the level shifter circuit 20 shown in FIG. 3 is equivalent to the level shifter circuit 20 shown in FIG. 2, and can be used to overcome the disadvantages of the prior art.

Figure 4:
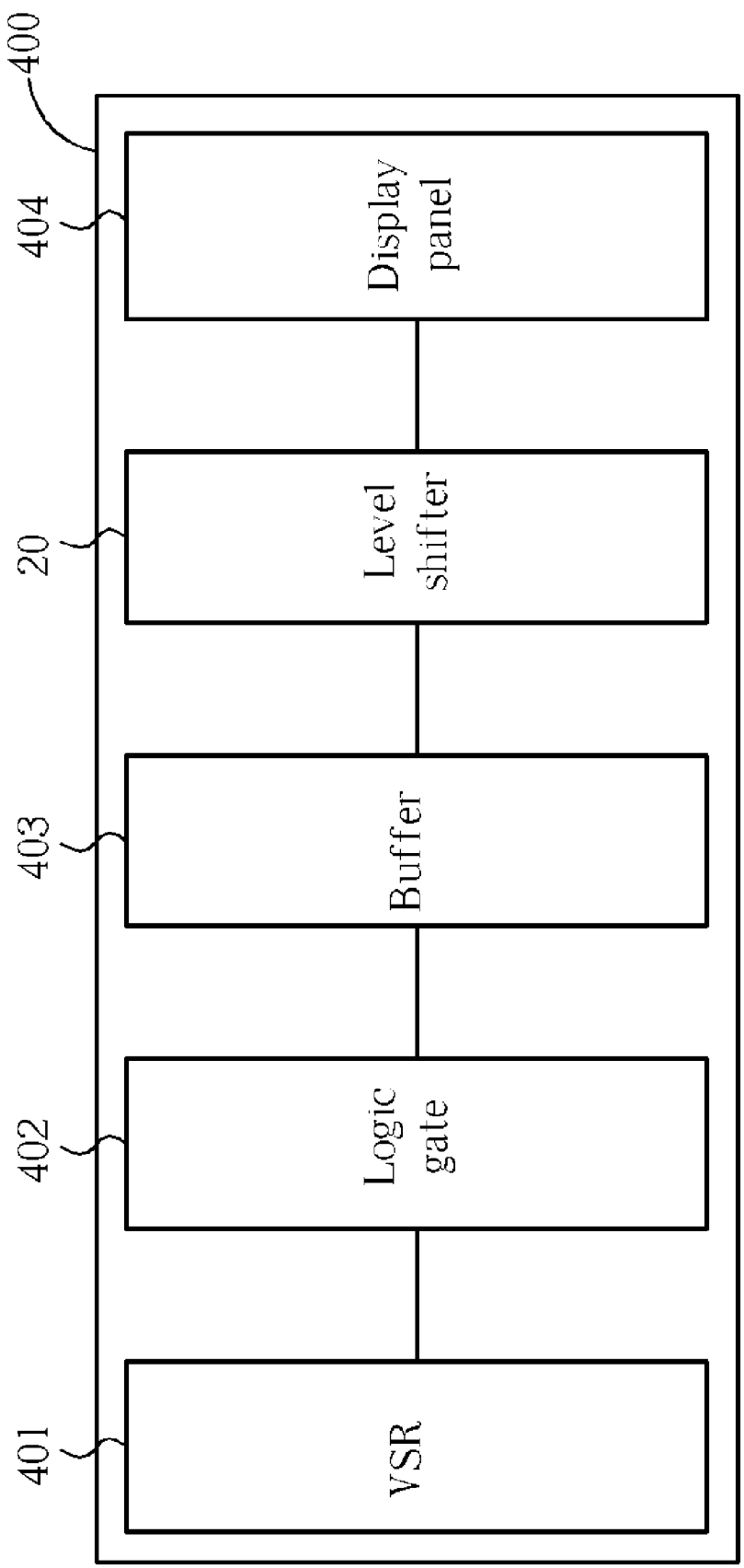
FIG. 4 is an electronic device according to the present invention.

Finally, the present invention level shifter circuit described above and shown in FIGS. 2-3 can be integrated in an electronic device as shown in FIG. 4. The electronic device 400 comprises a vertical shift register 401, the level shifter 20 described above, a plurality of logic gates 402, a buffer 403, and a display panel 404. The display panel 404 could be an organic LED (OLED) display panel. The vertical shift register 401 is coupled to the plurality of logic gates 402, and the plurality of logic gates 402 is coupled to the buffer 403. The buffer 403 is coupled to the level shifter circuit 20, and the level shifter circuit 20 is coupled to the display panel 404. The electronic device 400 may be a device such as a PDA, notebook computer, tablet computer, cellular phone, or a display monitor device, for example.

Of course, it should be noted that the level shifter circuit 20 of the present invention is not limited to TFT, or even MOS, processes. The circuit architecture of the present invention level shifter circuit 20 could easily be extended to many types of transistor processes. The level shifter circuit 20 could also be used in other types of applications. Any level shifter circuit that incorporates a bootstrapping circuit such as that shown in FIGS. 2-3 fulfills the art of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A level shifter circuit comprising:
   a buffer circuit comprising:
      a first transistor having a control terminal coupled to a variable input voltage of the level shifter circuit;
      a second transistor having a first terminal coupled to a first terminal of the first transistor; and
      a buffer switch having a first terminal coupled to the first terminal of the second transistor and a second terminal coupled to a control terminal of the second transistor; and
   a bootstrap circuit comprising:
      a diode circuit having a first terminal coupled to the variable input voltage of the level shifter circuit;
      a bootstrap switch having a first terminal coupled to the control terminal of the second transistor;
      a capacitor coupled between the first terminal of the second transistor and a second terminal of the bootstrap switch, and coupled to a second terminal of the diode circuit; and
   wherein the buffer switch closes to turn off the bootstrap switch when the input voltage at a low state and the buffer switch opens to enable the bootstrap switch when the input voltage is at a high state.

2. The level shifter circuit of claim 1, wherein the diode circuit is a diode transistor, wherein a control terminal of the diode transistor is coupled to another terminal of the diode transistor.

3. The level shifter circuit of claim 2, wherein the bootstrap switch is a transistor, and the buffer switch is a transistor.

4. The level shifter circuit of claim 3, wherein the bootstrap switch is a metal-oxide-semiconductor (MOS) transistor, the buffer switch is a MOS transistor, and the diode transistor is a MOS transistor.

5. The level shifter circuit of claim 4, wherein the bootstrap switch is a MOS transistor of a first type, the buffer switch is a MOS transistor of a second type, and the diode transistor is a MOS transistor of the second type.

6. The level shifter circuit of claim 5, wherein the first transistor is a MOS transistor of the second type and the second transistor is a MOS transistor of the second type.

7. The level shifter circuit of claim 6, wherein the first type is n-type MOS (NMOS) and the second type is p-type MOS (PMOS).

8. The level shifter circuit of claim 6, wherein the first type is p-type MOS (PMOS) and the second type is n-type MOS (NMOS).

9. The level shifter circuit of claim 6, wherein all transistors are thin film transistors.

10. A electronic device comprising:
a shift register;
the level shifter circuit of claim 1; and
a display panel.

11. The electronic device of claim 10 further comprising a plurality of logic gates.

12. The electronic device of claim 10 further comprising a buffer.

13. The electronic device of claim 10, wherein the display panel is an organic LED (OLED) panel.

14. The electronic device as claimed in claim 10, wherein the device is implemented as at least one of a PDA, notebook computer, tablet computer, cellular phone, or a display monitor device.

15. The level shifter circuit of claim 1, wherein the diode circuit is a diode.

16. The level shifter circuit of claim 1, wherein a second terminal of the first transistor is coupled to an upper bias voltage and a second terminal of the second transistor is coupled to a lower bias voltage.

17. The level shifter circuit of claim 1, wherein the first terminal of the diode circuit is a cathode terminal of the diode circuit, and the second terminal of the diode circuit is an anode terminal of the diode circuit.

* * * * *